(12) United States Patent
Shimamura et al.

(10) Patent No.: US 8,309,985 B2
(45) Date of Patent: Nov. 13, 2012

(54) LIGHT EMITTING DEVICE

(75) Inventors: Takayuki Shimamura, Osaka (JP);
Masayuki Ono, Osaka (JP); Reiko Taniguchi, Osaka (JP); Eiichi Satoh, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 91 days.

(21) Appl. No.: 13/061,052

(22) PCT Filed: Feb. 24, 2009

(86) PCT No.: PCT/JP2009/000787
§ 371 (c)(1),
(2), (4) Date: Feb. 25, 2011

(87) PCT Pub. No.: WO2010/023777
PCT Pub. Date: Mar. 4, 2010

(65) Prior Publication Data
US 2011/0156080 A1    Jun. 30, 2011

(30) Foreign Application Priority Data
Aug. 29, 2008    (JP) ................................. 2008-221271

(51) Int. Cl.
*H01L 33/32* (2010.01)
(52) U.S. Cl. ............................. 257/103; 257/79; 257/94
(58) Field of Classification Search .................. 257/103, 257/79, 94
See application file for complete search history.

(56) References Cited

U.S. PATENT DOCUMENTS

| 5,625,202 A * | 4/1997 | Chai ............................. 257/94 |
| 5,925,897 A | 7/1999 | Oberman |
| 7,285,799 B2 * | 10/2007 | Kim et al. ........................ 257/79 |
| 8,178,896 B2 * | 5/2012 | Shimamura et al. .......... 257/103 |
| 2004/0266043 A1 | 12/2004 | Oohata et al. |
| 2005/0236627 A1 * | 10/2005 | Kim et al. ........................ 257/79 |
| 2006/0175618 A1 | 8/2006 | Ishida |
| 2007/0147453 A1 | 6/2007 | Oohata et al. |
| 2007/0159063 A1 * | 7/2007 | Kubota et al. .................. 313/502 |
| 2008/0283846 A1 * | 11/2008 | Ohmae et al. .................... 257/79 |
| 2010/0026198 A1 * | 2/2010 | Arai et al. ...................... 315/246 |

(Continued)

FOREIGN PATENT DOCUMENTS

JP    2002-512734    4/2002

(Continued)

*Primary Examiner* — Eugene Lee
(74) *Attorney, Agent, or Firm* — McDermott Will & Emery LLP (57) ABSTRACT

A light emitting device is provided with: a pair of an anode and a cathode that are opposed to each other; and a phosphor layer, composed of a plurality of phosphor particles, that is sandwiched between the paired anode and cathode, from direction that is perpendicular to main surfaces of the anode and the cathode, and in this structure, each phosphor particle is a nitride semiconductor phosphor particle having a wurtzite crystal structure that contains an n-type nitride semiconductor portion and a p-type nitride semiconductor portion, with the n-type nitride semiconductor portion being made in contact with the cathode and the p-type nitride semiconductor portion being made in contact with the anode, and the n-type nitride semiconductor portion and the p-type nitride semiconductor portion have the common c-axe in the respective crystal structures thereof made in parallel with each other, with the n-type nitride semiconductor portion and the p-type nitride semiconductor portion being made in contact with each other on a plane in parallel with the c-axe.

12 Claims, 4 Drawing Sheets

U.S. PATENT DOCUMENTS

2011/0001153 A1* 1/2011 Tchakarov et al. ............. 257/98
2011/0043106 A1* 2/2011 Higashikawa et al. ....... 313/582
2011/0079795 A1* 4/2011 Nagai ............................. 257/77
2011/0175098 A1* 7/2011 Ono et al. ....................... 257/59

FOREIGN PATENT DOCUMENTS

| | | |
|---|---|---|
| JP | 2006-117735 | 5/2006 |
| JP | 2006-245564 | 9/2006 |
| WO | WO 2004/023569 A1 | 3/2004 |

* cited by examiner

LIGHT EMITTING DEVICE

RELATED APPLICATIONS

This application is the U.S. National Phase under 35 U.S.C. §371 of International Application No. PCT/JP2009/000787, filed on Feb. 24, 2009, which in turn claims the benefit of Japanese Application No. 2008-221271, filed on Aug. 29, 2008, the disclosures of which Applications are incorporated by reference herein.

BACKGROUND

1. Technical Field

The present invention relates to an electric field light emitting device of a direct current driving type in which nitride semiconductor phosphor particles having a wurtzite crystal structure are used.

2. Background Art

Among light emitting devices operated by a direct electric current, as practicable semiconductor materials to be used for light emitting devices, such as a blue light-emitting diode (Blue-LED) and an ultra-violet light emitting diode (UV-LED), in particular, GaN-based semiconductors typified by gallium nitride (GaN), indium nitride-gallium mixed crystal (InGaN), aluminum nitride-gallium mixed crystal (AlGaN) and indium nitride-aluminum-gallium mixed crystal (InAlGaN) have become a focus of attention, and researches and developments thereof have been vigorously carried out.

Conventionally, such a GaN-based semiconductor is manufactured as a single crystal thin film by allowing the semiconductor material to grow on a substrate by using an MOCVD (Metal Organic Chemical Vapor Deposition) method. However, it is very difficult to form a single crystal thin film with a large area of the GaN-based semiconductor by using the MOCVD method.

Meanwhile, as another candidate for the light emitting device to be operated by a direct electric current, an organic EL is proposed. The organic EL has an advantage in that it can be produced at low costs since it can be manufactured by using an inexpensive process such as vapor deposition and an inexpensive substrate such as a glass substrate can be used. However, the organic EL has a problem of reliability.

For this reason, a method has been proposed in which an inorganic phosphor is handled not as a thin film but as particles, so that by arranging the particles, a light emitting device is formed. The advantages of this method for the inorganic thin film dc light emitting device are that an inorganic phosphor can be generated on an inorganic thin film dc light emitting device without being influenced by the substrate or the like, and that a large-size screen can be easily formed by using this element. The advantages for the inorganic EL include the fact that, since an inorganic substance can be used as the phosphor, high reliability can be ensured. For example, a structural example has been proposed in which inorganic phosphor particles are arranged so that a light emitting device is formed as shown in Japanese Patent Laid-open Publication No. 2006-117735. This Japanese Patent Laid-open Publication No. 2006-117735 has proposed a technique in which, on the surface of a nitride semiconductor forming a nucleus, a light emitting layer made of another nitride semiconductor is present, and a nitride semiconductor layer is laminated on the light emitting layer so that these nitride semiconductor, light emitting layer and nitride semiconductor layer are allowed to form a quantum well structure.

SUMMARY OF THE INVENTION

However, even in the case where an electric field light emitting device is formed by using the phosphor particles in accordance with the prior art described in Japanese Patent Laid-open Publication No. 2006-117735, a problem arises in which its light emitting efficiency is low. There are two reasons for this. One is caused by the fact that, since the phosphor is excited by irradiation with an electron beam or ultraviolet rays, no p-type semiconductor is present, with the result that light emission by the recombination of an electron and a hole hardly occurs. The other is that, since the electric current path inside the phosphor is not defined in the prior art, two electric current paths, that is, an electric current path having low light emitting efficiency and an electric current path having high light emitting efficiency, are mixedly present, with the result that the efficiency as a light emitting device becomes low. In the case where an electric current is allowed to flow through a phosphor having a wurtzite crystal structure so as to emit light, its efficiency becomes better in the case where the electric current path is perpendicular to the c-axis, than that in the case where the electric current path is in parallel with the c-axis direction. This is because, in the case where the electric current path is in parallel with the c-axis direction, part of energy for use in emitting light is unnecessarily consumed due to influences of the polarity. Consequently, in order to emit light with high efficiency, the electric current path is desirably limited to only that in the direction perpendicular to the c-axis.

Therefore, an object of the present invention is to provide a light emitting device that can improve the light emitting efficiency of phosphor particles, and easily provide a large-area device with high light emitting efficiency.

According to the present invention, a light emitting device includes:

a pair of an anode and a cathode that are opposed to each other; and a plurality of phosphor particles that are sandwiched between the paired anode and cathode, from direction that is perpendicular to main surfaces of the anode and the cathode, wherein each phosphor particle is a nitride semiconductor phosphor particle having a wurtzite crystal structure that contains an n-type nitride semiconductor portion and a p-type nitride semiconductor portion, with the n-type nitride semiconductor portion being made in contact with the cathode and the p-type nitride semiconductor portion being made in contact with the anode, and the n-type nitride semiconductor portion and the p-type nitride semiconductor portion have the common c-axe in the respective crystal structures thereof made in parallel with each other, with the n-type nitride semiconductor portion and the p-type nitride semiconductor portion being made in contact with each other on a plane in parallel with the c-axe.

In addition, the phosphor particle may have a structure including:

the n-type nitride semiconductor portion;

an insulating film formed on the n-type nitride semiconductor portion, one portion of the insulating film being removed so that a plane in parallel with the c-axis of the n-type nitride semiconductor portion is exposed; and the p-type nitride semiconductor portion grown on the exposed n-type nitride semiconductor portion.

Furthermore, the phosphor particle may have a structure including:

the p-type nitride semiconductor portion;

an insulating film formed on the p-type nitride semiconductor portion, one portion of the insulating film being removed so that a plane in parallel with the c-axis of the p-type nitride semiconductor portion is exposed; and the n-type nitride semiconductor portion grown on the exposed p-type nitride semiconductor portion.

Still further, each phosphor particle may be arranged so that the c-axe in the respective crystal structures of the n-type nitride semiconductor portion and the p-type nitride semiconductor portion is made in parallel with main surfaces of the anode and the cathode.

In addition, the phosphor particle may be designed so that a particle length along the common c-axis and a minimum width of a bottom face perpendicular to the c-axis, satisfy the following relational expression:

(Particle length along the common $c$-axis)/(Minimum width of bottom face perpendicular to the $c$-axis)$\geq 2$.

In accordance with the light emitting device of the present invention, since the n-type nitride semiconductor portion and the p-type nitride semiconductor portion are included in a single phosphor particle, light emission is easily carried out by a combination of an electron and a hole so that the light emitting efficiency can be improved.

Moreover, in each single phosphor particle, the n-type nitride semiconductor portion and the p-type nitride semiconductor portion have the common c-axe in the respective crystal structures, that is, c-axe of the n-type nitride semiconductor portion and c-axe of the p-type nitride semiconductor portion is made in parallel with each other, with the n-type nitride semiconductor portion and the p-type nitride semiconductor portion being made in contact with each other on a plane in parallel with the c-axe. For this reason, all the electric current paths inside the phosphor particle can be aligned in a direction perpendicular to the c-axis so that light emission with high efficiency can be obtained; thus, it becomes possible to obtain a light emitting device with high light emitting efficiency.

Furthermore, the phosphor particle may be formed by processes in which an insulating film is formed on the n-type nitride semiconductor portion, and one portion of the insulating film is removed so as to allow a plane in parallel with the c-axis of the n-type nitride semiconductor portion to be exposed so that the p-type nitride semiconductor portion is grown on the exposed n-type nitride semiconductor portion. Alternatively, an insulating film may be formed on the p-type nitride semiconductor portion, and one portion of the insulating film may be removed so as to allow a plane in parallel with the c-axis of the p-type nitride semiconductor portion to be exposed so that the n-type nitride semiconductor portion is grown thereon. With this structure, the epitaxial surface and the nitride semiconductor portion to be grown thereon can be prepared as nitride semiconductors having the same wurtzite crystal structure so that it becomes possible to suppress strains and dislocations that tend to occur upon epitaxial growth, and consequently to improve the light emitting efficiency of the phosphor particle.

Moreover, each phosphor particle may be designed so as to satisfy an expression (particle length along the common c-axis)/(minimum width on bottom face perpendicular to c-axis)$\geq 2$; thus, the side faces of each phosphor particle can be easily brought into contact with either one of the electrodes so that light emission luminance can be enhanced.

BRIEF DESCRIPTION OF THE DRAWINGS

The present invention will become readily understood from the following description of preferred embodiments thereof made with reference to the accompanying drawings, in which like parts are designated by like reference numeral and in which.

EXPLANATION OF REFERENCE NUMERALS

10 Lower substrate
20 Lower electrode
30 Upper electrode
40 Upper substrate
50 Phosphor particle
51 Nucleus
52 n-type semiconductor
53 p-type semiconductor
54 Insulating film
61 Epitaxial substrate
62 Epitaxial mask
71 Reaction furnace
72 Gas line A
73 Gas line B
74 Gas line C
75 Ga metal
76 $MgCl_2$
77 Substrate holder

DETAILED DESCRIPTION OF THE PREFERRED EMBODIMENTS

A light emitting device in accordance with embodiments of the present invention will be described referring to the attached drawings. Before the description of the present invention proceeds, it is to be noted that substantially the same members are designated by the same reference numerals throughout the accompanying drawings.

First Embodiment

Figure 1:
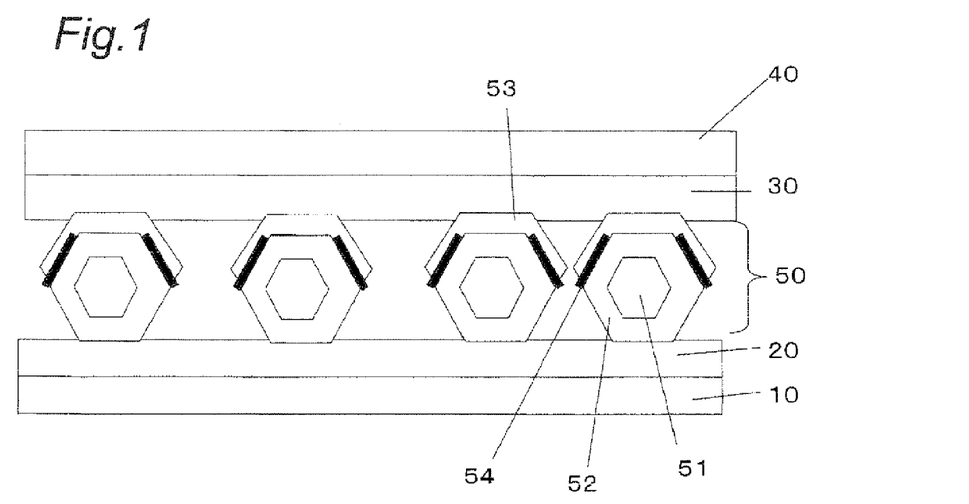
FIG. 1 is a schematic view illustrating a structure of a light emitting device in accordance with first embodiment of the present invention.

FIG. 1 shows a schematic structure of a light emitting device in accordance with first embodiment of the present invention. This light emitting device has a structure in which a lower electrode 20, phosphor particles 50, an upper electrode 30 and an upper substrate 40 that are placed on a lower substrate 10 in this order. Additionally, FIG. 1 shows a minimum structure for use in emitting light, and other members may be further included thereon.

In this light emitting device, since an n-type nitride semiconductor portion 52 and a p-type nitride semiconductor portion 53 are placed inside one phosphor particle 50, light is easily emitted by a combination of an electron and a hole so that the light emitting efficiency is improved. Moreover, in each single phosphor particle 50, the n-type nitride semiconductor portion 52 and the p-type nitride semiconductor portion 53 are aligned, with c-axe of the respective crystal structures being in parallel with each other, and the n-type nitride semiconductor portion 52 and the p-type nitride semiconductor portion 53 are brought into contact with each other on a plane that is in parallel with the c-axe. For this reason, all the electric current paths inside the phosphor particle 50 can be aligned to a perpendicular direction relative to the c-axe so that highly efficient light emission can be obtained and it becomes possible to obtain a light emitting device with high light emitting efficiency.

In the following, respective constituent members forming the light emitting device will be described.

<Lower Substrate and Upper Substrate>

The material for the lower substrate 10 and the upper substrate 40 is not particularly limited; however, in the case where a semiconductor in a phosphor particle is allowed to grow by using the lower substrate 10, it is necessary to select such a substrate as to be resistant to semiconductor epitaxial processes. Moreover, in order to take out light emission from the phosphor layer, a light transmitting material is desirably selected for either the lower substrate 10 or the upper substrate 40. In this case, not both of the substrates are necessarily required as long as the shape as the light emitting device can be maintained.

<Lower Electrode and Upper Electrode>

The material for the lower electrode 20 and the upper electrode 30 is not particularly limited as long as it has conductivity; however, in the case where a semiconductor in a phosphor particle is allowed to grow on the lower electrode 20, it is necessary to select such a substrate as to be resistant to the corresponding processes. As the material used for the cathode side, it is desirable to use a material having a low work function, such as aluminum, magnesium and silver, while, as the material used for the anode side, it is desirable to use a material having a high work function, such as gold and ITO.

Moreover, as the electrode on the light taking-out side, a light transmitting material is preferably used, and in the case where, a material that has no light transmitting property is used, it is preferable to select a film thickness of 100 nm or less so as to transmit light emission as much as possible. Additionally, in the case where a conductive substrate, such as an Si substrate or a metal substrate, with another element being doped thereon is used, since the substrate itself can be utilized as an electrode, it is not necessarily required to install an electrode separately. Moreover, either one of the electrodes is desirably made to have flexibility. Since the size of the phosphor particles 50 has variation, if neither of the electrodes is flexible, many particles which are not brought into contact with the two electrodes to fail to emit light tend to exist, with the result that the luminance of the light emitting device is lowered. Additionally, in this structure, the phosphor particles 50 and the respective electrodes 20 and 30 are directly brought into contact with each other; however, these may be brought into contact with each other with a conductor or a semiconductor being interposed therebetween.

<Phosphor Particles>

The phosphor particle 50 is composed of a nucleus 51, an n-type nitride semiconductor portion 52, a p-type nitride semiconductor portion 53 and an insulating film 54. This shows a minimum structure, and other members may be further installed therein. For example, a semiconductor layer having a band gap narrower than those of the n-type nitride semiconductor 52 and the p-type nitride semiconductor 53 may be placed on an interface between the n-type nitride semiconductor 52 and the p-type nitride semiconductor 53 so as to provide a double hetero structure. In addition, a buffer layer used for accelerating growth may be formed on the interface between the nucleus 51 and the semiconductor layer. Moreover, the n-type nitride semiconductor 52 and the p-type nitride semiconductor 53 are grown around the nucleus 51; however, the epitaxial position is not particularly limited, and they may be grown partially around the nucleus 51. The n-type nitride semiconductor portion 52 and the p-type nitride semiconductor portion 53 may be directly brought into contact with each other on a surface in parallel with the c-axis, or may be electrically brought into contact with each other with a conductor or a semiconductor being interposed therebetween.

<Nucleus>

The nucleus 51 is required for allowing the n-type nitride semiconductor portion 52 or the p-type nitride semiconductor portion 53 to grow, and is preferably prepared to have a wurtzite structure, with a lattice constant being set as close as possible to that of a nitride semiconductor to be grown. In the case where the semiconductor material to be grown is, for example, GaN, sapphire, ZnO, AlN and the like are proposed as candidates for the nucleus material. Moreover, the nucleus 51 may be of the same material as that of the semiconductor material to be inevitably grown.

<N-Type Nitride Semiconductor Portion and P-Type Nitride Semiconductor Portion>

Each of the n-type nitride semiconductor portion 52 and the p-type nitride semiconductor portion 53 is a nitride semiconductor having a wurtzite crystal structure. As the nitride semiconductor of the wurtzite crystal structure, AlN, GaN, InN, $Al_xGa_{(1-x)}N$, $In_yGa_{(1-y)}N$ and the like can be mentioned. Each semiconductor portion preferably has a single crystal structure, and as the means for growing the single crystal structure, a vapor phase epitaxy method is preferably used. As the epitaxial means using the vapor phase epitaxy, a halide vapor phase epitaxy (HVPE) method, a metal-organic chemical vapor phase deposition (MOCVD) method and the like can be mentioned. In the epitaxial method for a semiconductor using the vapor phase epitaxy, a particle forming a nucleus is placed on a substrate and heated to a temperature required, and after that, a material gas is allowed to flow over the nucleus thereon so that a semiconductor is allowed to grow on the nucleus on the substrate. In the case where an n-type semiconductor is formed, Si may be doped so that an n-type semiconductor may be formed. Additionally, in the case of a nitride semiconductor, it exerts characteristics of the n-type semiconductor even in a non-doped state. In contrast, in the case where a p-type semiconductor is formed, Mg may be doped so that the resulting semiconductor is allowed to exert characteristics of the p-type semiconductor.

<Insulating Film>

Although not necessarily required, the insulating film 54 is desirably formed on one portion of an interface between the n-type nitride semiconductor portion 52 and the p-type nitride semiconductor portion 53. In general, upon being allowed to be epitaxially grown, a crystal is grown from various portions in the plane of the substrate, and in many cases, crystals that are growing horizontally relative to the substrate mutually block the growth thereof, with the result that dislocations occur. In order to solve this problem, by interposing an insulating substance which allows no crystal to grow on the substrate, it becomes possible to prevent the blocking of the growth, and consequently to reduce the dislocations. In this case, the insulating film 54 is formed so as to cover the n-type nitride semiconductor portion 52 or the p-type nitride semiconductor portion 53, and one portion of the insulating film 54 is removed so as to allow only one portion of its surface in parallel with the c-axis to be exposed. Thus, by allowing only the one portion of its surface in parallel with the c-axis to be exposed as an epitaxial surface, the growth in the horizontal direction to the epitaxial surface can be suppressed so that the growth of the entire crystal is prevented from being blocked. As the material for the insulating film 54, for example, $Al_2O_3$, $SiO_2$, $TiO_2$ and $BaTiO_3$ are proposed.

<Method for Manufacturing Light Emitting Device>

With respect to the manufacturing processes of the light emitting device also, corresponding methods are not particularly limited, and referring to FIGS. 2a to 2j, the following description will give one example thereof.

Figure 2A:
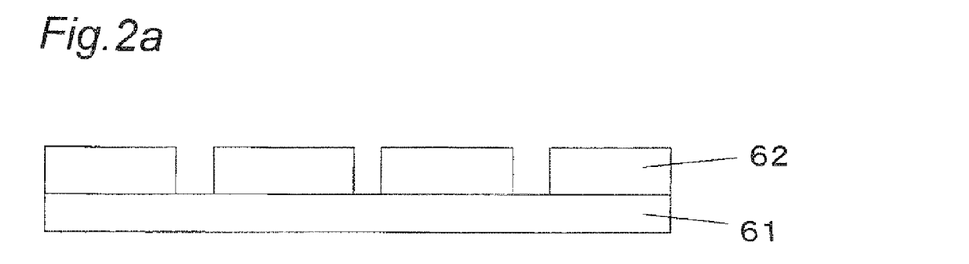
FIG. 2a is a drawing that illustrates one process of manufacturing processes of the light emitting device in accordance with first embodiment.

(a) On an epitaxial substrate 61 used for allowing phosphor particles to be grown thereon, an epitaxial mask 62 is formed in a manner as shown in FIG. 2a. In this case, the epitaxial substrate 61 needs to be resistant to processes by which the n-type nitride semiconductor portion 52 and the p-type nitride semiconductor portion 53 will be formed later. Moreover, in the case where a halide vapor phase epitaxy (HVPE) method or a metal-organic chemical vapor deposition (MOCVD) method is used, the substrate needs to have a heat resisting property of 1000° C. or more in an $NH_3$ atmosphere. Moreover, such a substrate as to allow a GaN semiconductor to epitaxially grow in the c-axis direction is preferably used. As an example for the material, a sapphire substrate with a plane orientation (0, 0, 0, 1) or a silicon substrate with a plane orientation (1, 1, 1) can be proposed.

As the material for the epitaxial mask 62, any material may be used as long as it is resistant to nucleus forming processes and can be easily removed. For example, $SiO_2$ is proposed. Moreover, as a method for forming pore portions of the epitaxial mask 62, for example, a forming method in which a lift-off process is used by using a photoresist material, a method in which portions other than the pore portions are directly formed by using an inkjet method or the like, and a method in which portions other than the pore portions are directly formed by using a formation mask can be mentioned.

Figure 2B:
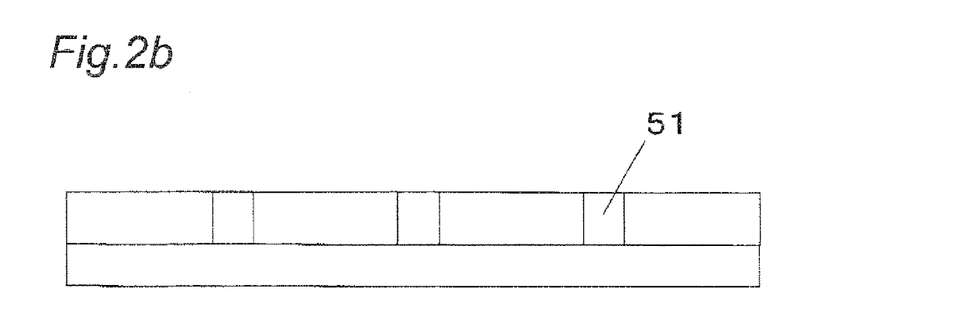
FIG. 2b is a drawing that illustrates another process of the manufacturing processes of the light emitting device in accordance with first embodiment.

(b) Next, as shown in FIG. 2b, a nucleus 51 is formed. As the method for forming the nucleus material, although not particularly limited, a sputtering method, a halide vapor phase epitaxy (HVPE) method, a metal-organic chemical vapor deposition (MOCVD) method or the like is preferably used.

Figure 2C:
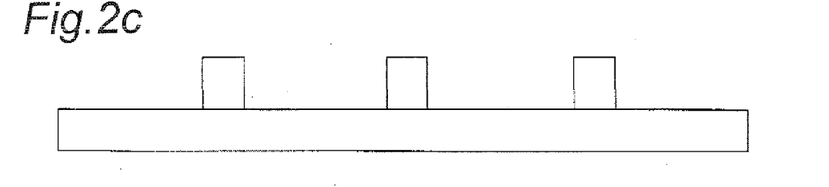
FIG. 2c is a drawing that illustrates still another process of the manufacturing processes of the light emitting device in accordance with first embodiment.

(c) Thereafter, as shown in FIG. 2c, the mask 62 is removed. In this process for removing the mask 62, a means that gives no influences on the nuclei 51 needs to be used. Alternatively, the nuclei 51 may be directly formed on the epitaxial substrate 61 so as to stand thereon in parallel with one another, without using the epitaxial mask. For example, by using a means described in Jpn. J. Appl. Phys. Vol. 38 (1999) pp. 6873-6877, ZnO may be directly formed on the substrate 61 so as to form the nuclei 51 standing thereon in parallel with one another.

Figure 2D:
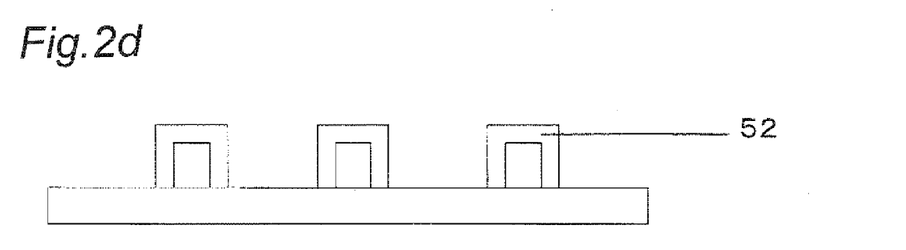
FIG. 2d is a drawing that illustrates still another process of the manufacturing processes of the light emitting device in accordance with first embodiment.

(d) Thereafter, an n-type nitride semiconductor portion 52 is formed on each nucleus 51, as shown in FIG. 2d. As the method therefor, as described above, the halide vapor phase epitaxy (HVPE) method, the metal-organic chemical vapor deposition (MOCVD) method, or the like is preferably used.

Figure 2E:
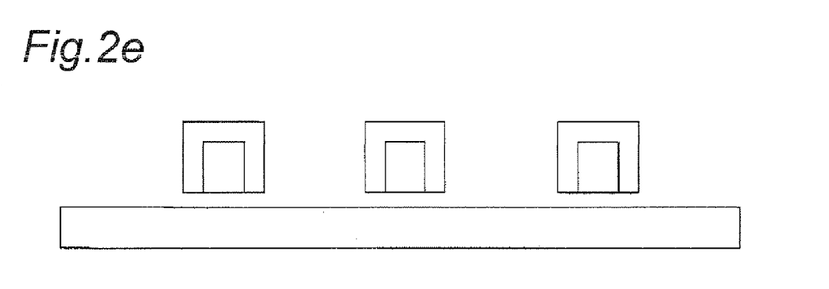
FIG. 2e is a drawing that illustrates still another process of the manufacturing processes of the light emitting device in accordance with first embodiment.

(e) As shown in FIG. 2e, particles each of which has the n-type nitride semiconductor portion 52 formed on the nucleus 51 are separated from the epitaxial substrate 61. As the method for separating these, for example, a mechanical method such as a method for applying vibrations or a method for scraping them off by using a sharp member, or a chemical method such as dissolution of the substrate may be used.

Figure 2F:
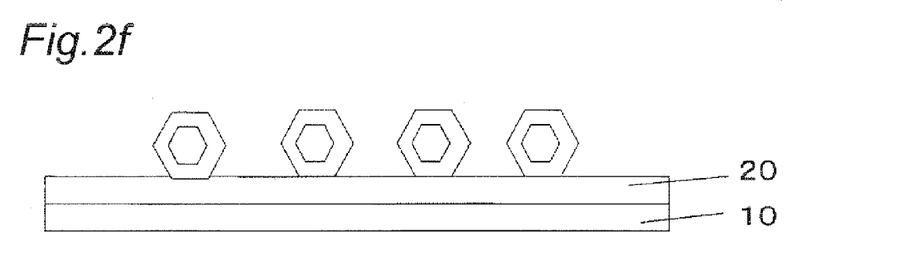
FIG. 2f is a drawing that illustrates still another process of the manufacturing processes of the light emitting device in accordance with first embodiment.

(f) Next, as shown in FIG. 2f, the particles, each having the nucleus 51 and the n-type nitride semiconductor portion 52, are arranged on the lower substrate 10 provided with the lower electrode 20. In this case, the particles are preferably arranged thereon so that the c-axis of each particle is aligned in parallel with the plane of the substrate 10. For this reason, (the aspect ratio) corresponding to (the particle length along the common c-axis)/(the minimum width of the bottom face perpendicular to the c-axis) of the phosphor particle is preferably set to 2 or more. Moreover, when the lower substrate 10 is vibrated upon arranging the particles, the longitudinal direction of each of the particles, that is, the c-axis, can be easily oriented in parallel with the plane; therefore, this method is more desirably used.

Figure 2G:
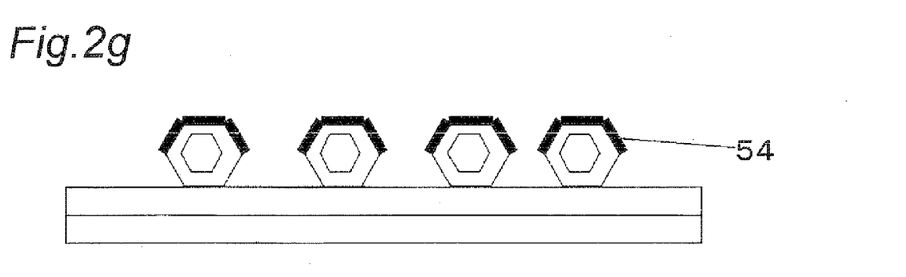
FIG. 2g is a drawing that illustrates still another process of the manufacturing processes of the light emitting device in accordance with first embodiment.

(g) Next, as shown in FIG. 2g, an insulating film 54 is formed on each of the particles. As the forming method, although not particularly limited, for example, a sputtering method is proposed.

Figure 2H:
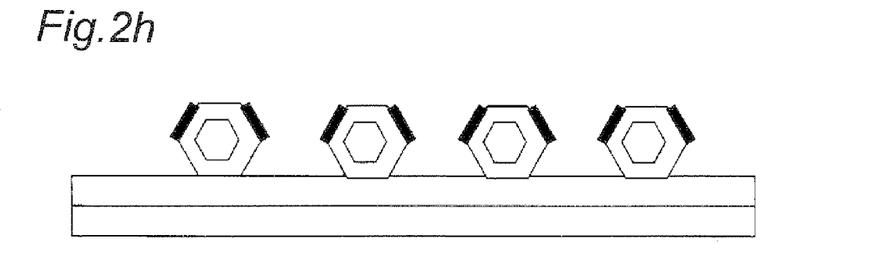
FIG. 2h is a drawing that illustrates still another process of the manufacturing processes of the light emitting device in accordance with first embodiment.

(h) Moreover, as shown in FIG. 2h, one portion of the insulating film 54 is removed. In this case, the plane of the particle in parallel with the c-axis is made to be exposed. As the removing method for the insulating film 54, although not particularly limited, for example, a mechanical polishing method, a wet etching method, and a dry etching method can be proposed.

Figure 2I:
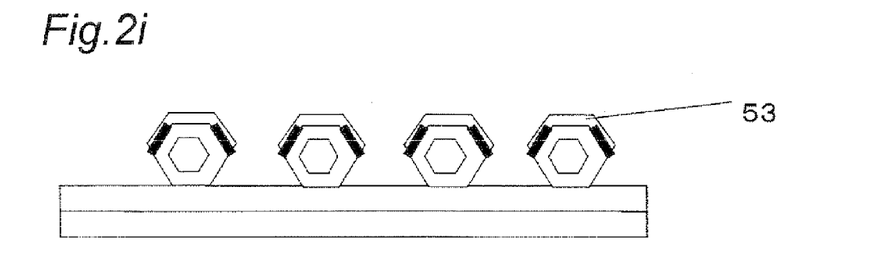
FIG. 2i is a drawing that illustrates still another process of the manufacturing processes of the light emitting device in accordance with first embodiment.

(i) As shown in FIG. 2i, a p-type nitride semiconductor portion 53 is formed on the plane in parallel with the c-axis of the n-type nitride semiconductor portion 52 that has been exposed by removing one portion of the insulating film 54. As the forming method for the p-type nitride semiconductor portion 53, as described above, the halide vapor epitaxy (HPVE) method, the metal-organic chemical vapor deposition (MOCVD) method, or the like can be preferably used. Moreover, in these processes, upon forming the p-type nitride semiconductor portion, both of the lower electrode 20 and the lower substrate 10 need to have a heat resistant property of 1000° C. or more in an $NH_3$ atmosphere. As the material for the lower substrate 10, a sapphire substrate, a silicon substrate or the like is proposed, and as the material for the lower electrode 20, molybdenum, tantalum, or the like is proposed.

Figure 2J:
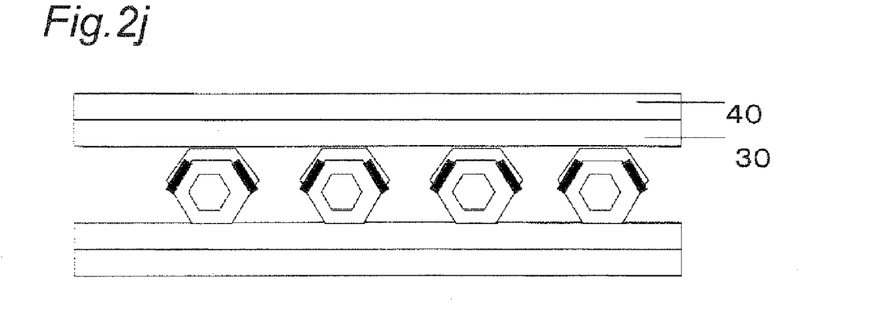
FIG. 2j is a drawing that illustrates still another process of the manufacturing processes of the light emitting device in accordance with first embodiment.

(j) Thereafter, as shown in FIG. 2j, the upper electrode 30 and the upper substrate 40 are successively installed thereon so that a light emitting device is obtained.

EXAMPLES

Example 1

In the following, a method for manufacturing a light emitting device in accordance with example 1 will be described.

(a) A sapphire substrate of 2 inches (5.08 cm) having a plane orientation (0, 0, 0, 1) was used as an epitaxial substrate. On the sapphire substrate, an $SiO_2$ film having a thickness of 10 μm was formed by using a sputtering method, with a formation mask being interposed therebetween. The diameter of each pore portion was 2 μm. An $SiO_2$ target was used as the target, and the sputtering was carried out in an Ar gas atmosphere so as to form the film.

(b) An AlN film was formed thereon by sputtering as a nucleus film. An Al target was used as the target, and the sputtering was carried out in an $N_2$ gas atmosphere so as to form the film. The AlN was grown in the c-axis direction, with a thickness of 10 μm.

(c) The epitaxial substrate on which an epitaxial mask and nuclei had been formed was immersed in a 3% aqueous hydrofluoric acid solution so that the epitaxial mask was removed.

(d) On the epitaxial substrate on which only the nuclei were formed, a non-doped GaN layer was formed as an n-type nitride semiconductor layer, by using a halide vapor phase epitaxy (HVPE) method. The processes will be described in detail referring to FIG. 3.

Figure 3:
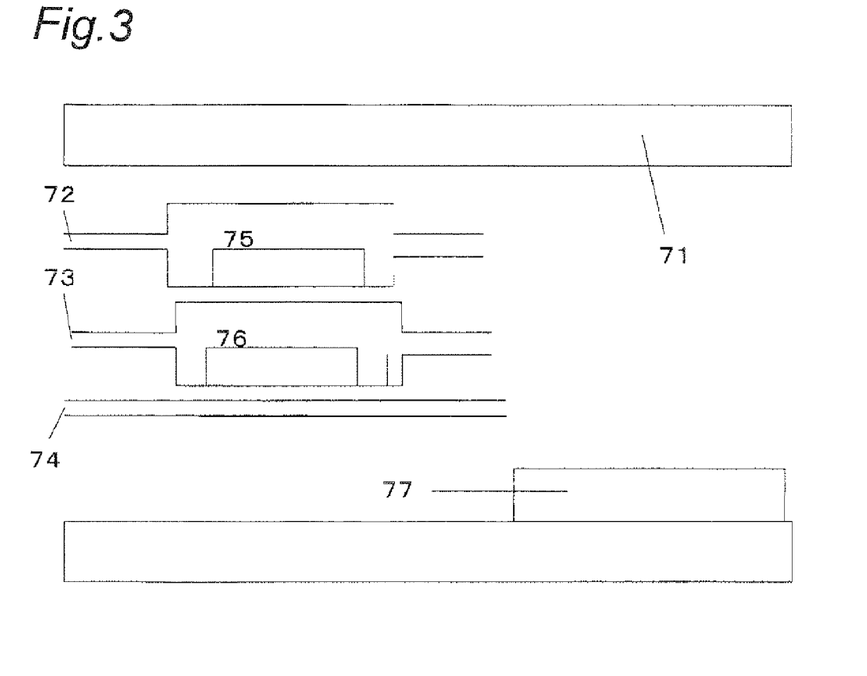
FIG. 3 is a schematic view illustrating a structure of an HVPE device used for manufacturing phosphor particles in accordance with first embodiment.

Through a gas line A72, HCl was allowed to flow at 3 cc/min, and $N_2$ was also allowed to flow at 250 cc/min, with Ga metal 75 being placed in the mid way. Nothing was allowed to flow through a gas line B73, and $NH_3$ was allowed to flow through a gas line C74 at 250 cc/min. Moreover, through the entire portions of a furnace, $N_2$ was allowed to flow at 3000 cc/min. The temperature of the reaction furnace was set to 1000° C., and a film was grown for 2 minutes so that a non-doped GaN film having a film thickness of 2 μm was formed. At this time, the width of the bottom face of each particle was set to 6 μm and the height thereof was set to 12 μm.

(e) After an n-type nitride semiconductor layer had been formed, the epitaxial substrate was subjected to mechanical vibrations so that particles, each having the nucleus and n-type nitride semiconductor, were taken out from the epitaxial substrate, and the particles were placed on an n-type Si substrate doped with boron, with mechanical vibrations being applied thereto. In this case, the n-type Si substrate had both of the functions of the lower substrate and the lower electrode.

(f) The n-type Si substrate on which the particles, each having the nucleus and the n-type nitride semiconductor, were placed was attached to a sputtering device, and an $Al_2O_3$ film was formed thereon as an insulating film by using a sputtering method. As the target, an $Al_2O_3$ target was used, and the sputtering process was carried out in an Ar gas so as to form the film. The thickness was set to 0.2 μm.

(g) Thereafter, inside the sputtering device, an Ar plasma was then generated on the substrate side so that the surface of the insulating film was dry-etched. Thus, one portion of the plane in parallel with the c-axis of the n-type nitride semiconductor was exposed.

(h) Thereafter, the n-type Si substrate on which the particles, each having the nucleus, the n-type nitride semiconductor and the insulating film, were placed was again attached to an HVPE device, and a p-type nitride semiconductor layer was formed on the exposed plane in parallel with the c-axis of the n-type nitride semiconductor. Referring to FIG. 3, these processes will also be explained.

Through a gas line A72, HCl was allowed to flow at 3 cc/min, and $N_2$ was also allowed to flow at 250 cc/min, with Ga metal 75 being placed in the mid way. Powder 76 of $MgCl_2$ was placed in gas line B73, and an $N_2$ gas was allowed to flow through the gas line B73 at 250 cc/min. Through a gas line C74, $NH_3$ was allowed to flow at 250 cc/min. Moreover, through the entire portions of a furnace, $N_2$ was allowed to flow at 3000 cc/min. The temperature of the reaction furnace was set to 1000° C., and a film was grown for 2 minutes so that an Mg-doped GaN film having a film thickness of 2 μm was formed. After the reaction, the temperature was lowered, with $N_2$ being allowed to flow through the entire portions of the furnace at 3000 cc/min, and when the temperature dropped to 700° C., this temperature was kept for one hour, and the temperature of the inside of the furnace was then again lowered.

(i) Thereafter, an upper substrate made of glass to which an ITO paste was applied with a thickness of 2 μm was pressed onto the lower substrate, with its paste surface facing down, so that a light emitting device was prepared.

(j) Onto the upper side of the upper substrate, a paste prepared by dispersing ZnS:Cu and Al phosphors in an acrylic resin was applied with a thickness of 2 μm.

Thus, a light emitting device was obtained.

With the Si side of the resulting light emitting device being used as a cathode and the ITO paste side thereof being used as an anode, a dc voltage of 15 V was applied between the two electrodes so that light was emitted. At this time, ultraviolet rays were emitted from the phosphor particles, and the wavelengths thereof were converted by the ZnS:Cu and Al phosphors so that light emission of green color was obtained. Its luminance was 560 $cd/m^2$, and its light emitting efficiency was 1.2 lm/W.

Example 2

In example 2, the same method as that of example 1 was carried out except that no insulating film for phosphor particles was formed so that a light emitting device was obtained.

When a voltage was applied to the resulting light emitting device in the same manner as in example 1 so as to emit light, its luminance was 520 $cd/m^2$, and its light emitting efficiency was 1.1 lm/W.

Comparative Example 1

In example 2, the thickness of the $SiO_2$ film serving as a formation mask was altered to 1 μm and the diameter of each pore portion was altered to 2 μm, with the thickness of the AlN film serving as the nuclei being altered to 1 μm, and particles, each having a nucleus and an n-type semiconductor, were taken out, and upon placing this on an n-type Si substrate doped with boron, no mechanical vibrations were given thereto. As a result, most of the particles were occupied by those phosphor particles, with the c-axis thereof being made perpendicular to the substrate.

When a voltage was applied to the resulting light emitting device in the same manner as that of example 1 so as to emit light, its luminance was 320 $cd/m^2$, and its light emitting efficiency was 0.6 lm/W.

Comparative Example 2

The same processes as those of comparative example 1 were carried out except that, in place of forming no p-type semiconductor layer on phosphor particles relating to comparative example 1, an n-type semiconductor layer was film-formed with a thickness of 4 μm so that a light emitting device was prepared.

When a voltage was applied to the resulting light emitting device in the same manner so as to emit light, its luminance was 80 $cd/m^2$, and its light emitting efficiency was 0.15 lm/W.

In accordance with the present invention, it is possible to provide a light emitting device that has high light emitting efficiency and is easily allowed to have a large area.

The invention claimed is:

1. A light emitting device comprising:
   a pair of an anode and a cathode that are opposed to each other; and
   a plurality of phosphor particles that are sandwiched between the paired anode and cathode, from direction that is perpendicular to main surfaces of the anode and the cathode,
   wherein each phosphor particle is a nitride semiconductor phosphor particle having a wurtzite crystal structure that contains an n-type nitride semiconductor portion and a p-type nitride semiconductor portion, with the n-type nitride semiconductor portion being made in contact with the cathode and the p-type nitride semiconductor portion being made in contact with the anode, and
   the n-type nitride semiconductor portion and the p-type nitride semiconductor portion have the common c-axe in the respective crystal structures thereof made in parallel with each other, with the n-type nitride semiconductor portion and the p-type nitride semiconductor portion being made in contact with each other on a plane in parallel with the c-axe.

2. The light emitting device according to claim 1, wherein the phosphor particle has a structure including:
   the n-type nitride semiconductor portion;
   an insulating film formed on the n-type nitride semiconductor portion, one portion of the insulating film being removed so that a plane in parallel with the c-axis of the n-type nitride semiconductor portion is exposed; and
   the p-type nitride semiconductor portion grown on the exposed n-type nitride semiconductor portion.

3. The light emitting device according to claim 1, wherein the phosphor particle has a structure including:
   the p-type nitride semiconductor portion;
   an insulating film formed on the p-type nitride semiconductor portion, one portion of the insulating film being removed so that a plane in parallel with the c-axis of the p-type nitride semiconductor portion is exposed; and
   the n-type nitride semiconductor portion grown on the exposed p-type nitride semiconductor portion.

4. The light emitting device according to claim 1, wherein each phosphor particle is arranged so that the c-axe in the respective crystal structures of the n-type nitride semiconductor portion and the p-type nitride semiconductor portion is made in parallel with main surfaces of the anode and the cathode.

5. The light emitting device according to claim 1, wherein each phosphor particle is designed so that a particle length along the common c-axis and a minimum width of a bottom face perpendicular to the c-axis, satisfy the following relational expression:

(Particle length along the common $c$-axis)/(Minimum width of bottom face perpendicular to $c$-axis)$\geq 2$.

6. The light emitting device according to claim 2, wherein each phosphor particle is arranged so that the c-axe in the respective crystal structures of the n-type nitride semiconductor portion and the p-type nitride semiconductor portion is made in parallel with main surfaces of the anode and the cathode.

7. The light emitting device according to claim 3, wherein each phosphor particle is arranged so that the c-axe in the respective crystal structures of the n-type nitride semiconductor portion and the p-type nitride semiconductor portion is made in parallel with main surfaces of the anode and the cathode.

8. The light emitting device according to claim 2, wherein each phosphor particle is designed so that a particle length along the common c-axis and a minimum width of a bottom face perpendicular to the c-axis, satisfy the following relational expression:

(Particle length along the common $c$-axis)/(Minimum width of bottom face perpendicular to $c$-axis)$\geq 2$.

9. The light emitting device according to claim 3, wherein each phosphor particle is designed so that a particle length along the common c-axis and a minimum width of a bottom face perpendicular to the c-axis, satisfy the following relational expression:

(Particle length along the common $c$-axis)/(Minimum width of bottom face perpendicular to $c$-axis)$\geq 2$.

10. The light emitting device according to claim 4, wherein each phosphor particle is designed so that a particle length along the common c-axis and a minimum width of a bottom face perpendicular to the c-axis, satisfy the following relational expression:

(Particle length along the common $c$-axis)/(Minimum width of bottom face perpendicular to $c$-axis)$\geq 2$.

11. The light emitting device according to claim 6, wherein each phosphor particle is designed so that a particle length along the common c-axis and a minimum width of a bottom face perpendicular to the c-axis, satisfy the following relational expression:

(Particle length along the common $c$-axis)/(Minimum width of bottom face perpendicular to $c$-axis)$\geq 2$.

12. The light emitting device according to claim 7, wherein each phosphor particle is designed so that a particle length along the common c-axis and a minimum width of a bottom face perpendicular to the c-axis, satisfy the following relational expression:

(Particle length along the common $c$-axis)/(Minimum width of bottom face perpendicular to $c$-axis)$\geq 2$.

* * * * *